United States Patent
Hikmet et al.

(10) Patent No.: US 9,153,753 B2
(45) Date of Patent: Oct. 6, 2015

(54) POLYMERIC MATRIX WITH ORGANIC PHOSPHOR AND MANUFACTORY THEREOF

(75) Inventors: Rifat Ata Mustafa Hikmet, Eindhoven (NL); Jan Cornelis Kriege, Mierlo (NL); Paulus Albertus Van Hal, Waalre (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 104 days.

(21) Appl. No.: 13/982,889

(22) PCT Filed: Jan. 27, 2012

(86) PCT No.: PCT/IB2012/050393
§ 371 (c)(1),
(2), (4) Date: Jul. 31, 2013

(87) PCT Pub. No.: WO2012/107852
PCT Pub. Date: Aug. 16, 2012

(65) Prior Publication Data
US 2013/0307010 A1    Nov. 21, 2013

(30) Foreign Application Priority Data

Feb. 9, 2011 (EP) .................................. 11153772

(51) Int. Cl.
*H01L 33/00* (2010.01)
*H01L 33/50* (2010.01)
(Continued)

(52) U.S. Cl.
CPC ................ *H01L 33/502* (2013.01); *B29D 7/01* (2013.01); *C09K 11/06* (2013.01); *H01L 33/50* (2013.01); *C09K 2211/1011* (2013.01); *G02B 5/206* (2013.01)

(58) Field of Classification Search
CPC ............................. H01L 33/50; H01L 33/502
USPC .......................................................... 257/98
See application file for complete search history.

(56) References Cited

U.S. PATENT DOCUMENTS

2005/0025422 A1    2/2005    Magnusson et al.
2006/0275591 A1   12/2006    MacDonald et al.
2007/0273274 A1   11/2007    Horiuchi et al.

FOREIGN PATENT DOCUMENTS

WO          0007039 A1    2/2000
WO       2010032179 A1    3/2010
WO       2012042438 A1    4/2012

OTHER PUBLICATIONS

Xiaodi Niu et al; "Balanced Charge Transport and Enhanced White Electroluminescence From a Single White Emissive Polymer Via Thermal Annealing", Applied Physics Letters vol. 96, 073303, 2010, XP002638835.

(Continued)

*Primary Examiner* — Douglas Menz
(74) *Attorney, Agent, or Firm* — Yuliya Mathis

(57) ABSTRACT

A method for manufacturing a wavelength converting element (202, 301, 302, 303, 310, 312) the method comprising providing (100) a polymeric carrier material (200) having a first wavelength converting material (201) dispersed or molecular dissolved therein; the first wavelength converting material (201) is adapted to convert light of a first wavelength to light of a second wavelength, deforming (101) the polymeric carrier material at a first temperature at or above the glass transition temperature thereof such that at least part of the polymeric carrier material (200) is crystallized; and annealing (102) the polymeric carrier material(200) at a second temperature below the melting temperature thereof. Treatment of a polymeric material(200) according to the invention improves the stability and lifetime of a wavelength converting material (201) comprised in a such a treated polymeric material. A polymeric material (200) treated according to the invention may comprise polymeric molecules having a degree of crystalline being 10% by volume or more.

19 Claims, 3 Drawing Sheets

(51) Int. Cl.
    *C09K 11/06*     (2006.01)
    *B29D 7/01*     (2006.01)
    *G02B 5/20*     (2006.01)

(56) References Cited

OTHER PUBLICATIONS

Rong-Ho Lee et al; "Guest-Host Ferroelectric Side-Chain Liquid Crystalline Polymeric Materials With Improved Electro-Opticasl Properties", Journal of Polymer Research, vol. 5, No. 1, pp. 37-44, Jan. 1998.

Danuta Bauman et al; "Molecular Oreintation in Liquid Crystalline Side Chain Polymers Doped With Dichroic Dye as Studied by Optical Spectroscopy Methods", Mol Cryst. and Liq. Cryst. 2000, vol. 352, pp. 67-76, XP009071482.

Tzyy-Jiann Wang et al; "Flexible Polymer Light-Emitting Devices Based on Ruthenium Complexes", Microwave and Opticl Technology Letters, vol. 38, No. 5, Sep. 5, 2003, pp. 406-409, XP002638833.

Hengwen Yang et al; "Preparation and Photoluminescence Properties of Dye Doped Polymerization Cyrstalline Colloidal Arrays", Materials Letters, 6-4, 2010, pp. 1329-1331, XP002638834.

Jae-Wook Kang et al; "All-Optical Polymeric Interferometeric Wavelength Converter Comprising an Excited State Intramolecular Proton Transfer Dye", Applied Physics Letters, vol. 84, No. 21, May 24, 2004, XP002638836, pp. 4421-4423.

Junling Wang et al; "Photoluminescence and Electroluminescence From a Hybrid of Lumogen Red in Nanoporous-Silica", Journal of Nanoscience and Nanotechnology, vol. 8, pp. 1336-1340, 2008, XP002638842.

G.A.J. Orchard et al; "Oxygen and Water-Vapor Diffusion Through Biaxially Oriented Poly (ethylene terephthalate)", Journal of Polymer Science Part B: Polymer Physics, John Wiley & Sons, Inc, US, vol. 28, No. 5, Jan. 1, 1990, pp. 603-621, XP01145666.

S. Kavesh et al; "Meaning and Measurement of Crystallinity in Polymers: A Review", Polymer Engineering & Science, vol. 9, No. 6, Nov. 1, 1969, pp. 452-460, XP055157568.

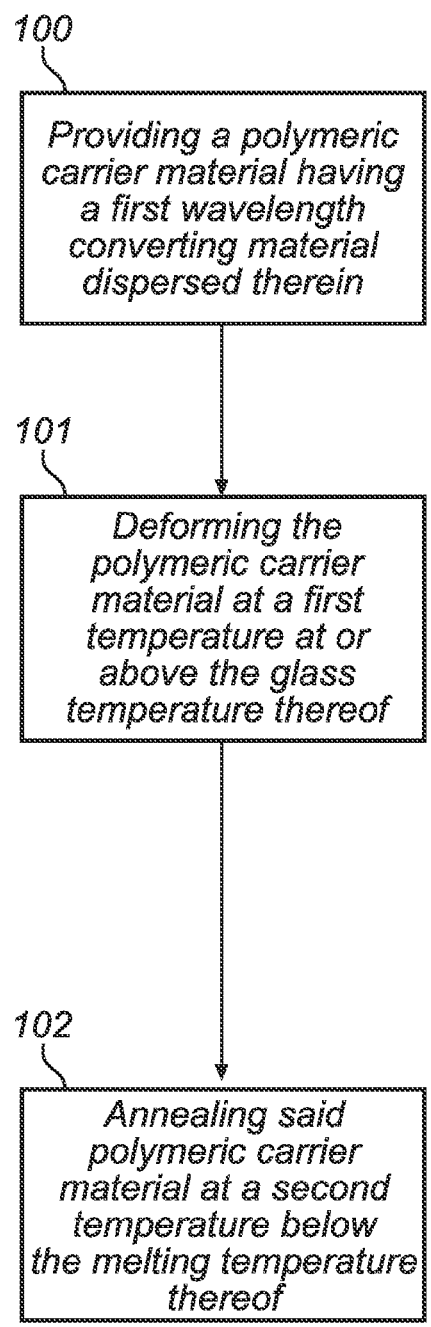
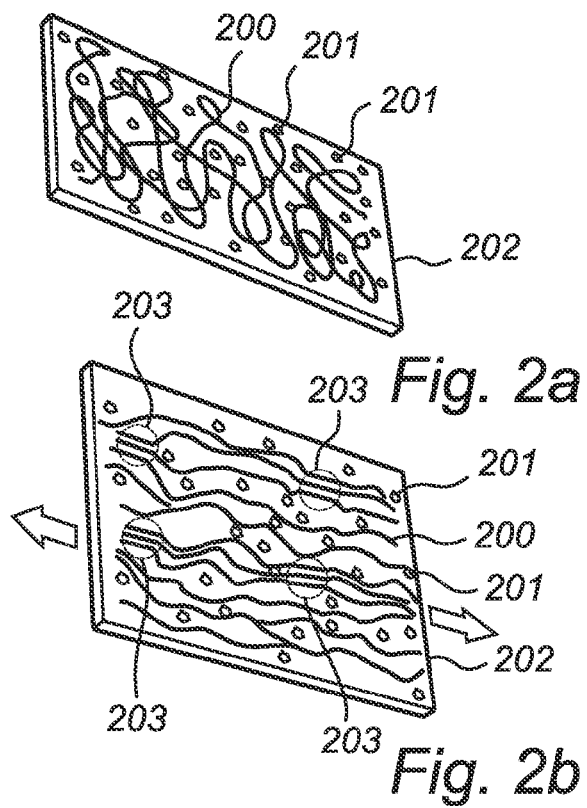
Fig. 2a
Fig. 2b
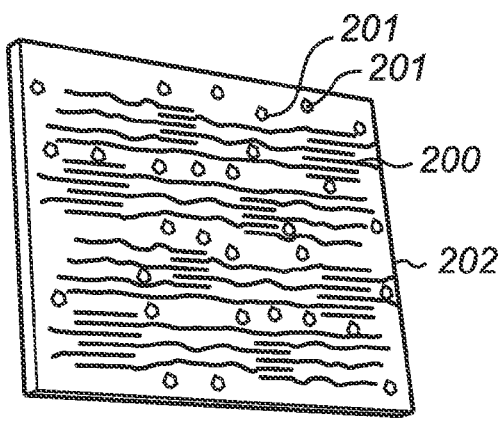
Fig. 2c
Fig. 1

POLYMERIC MATRIX WITH ORGANIC PHOSPHOR AND MANUFACTORY THEREOF

FIELD OF THE INVENTION

The present invention relates to a wavelength converting element comprising a polymeric carrier material having a phosphor dispersed therein, a light-emitting device comprising such a light converting element, and a method for manufacturing such a light converting element.

BACKGROUND OF THE INVENTION

Light-emitting diode (LED) based illumination devices are increasingly used for a wide variety of lighting applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting materials. To produce an LED based illumination device having a desired color (e.g., white) output, a suitable wavelength converting material, commonly known as a phosphor, may be used which converts part of the light emitted by the LED into light of longer wavelengths so as to produce a combination of light having desired spectral characteristics. The wavelength converting material may be applied directly on the LED die, or it may be arranged at a certain distance from the phosphor (so-called remote configuration).

Many inorganic materials have been used as phosphor materials for converting blue light emitted by the LED into light of longer wavelengths. However, inorganic phosphors suffer from the disadvantages that they are relatively expensive. Furthermore, inorganic phosphors are light scattering particles, thus always reflecting a part of the incoming light, which leads to loss of efficiency in a device. Furthermore, inorganic LED phosphors have limited quantum efficiency and a relatively broad emission spectrum, in particular for the red emitting LED phosphors, which leads to additional efficiency losses.

Currently, organic phosphor materials are being considered for replacing inorganic phosphor in LEDs where conversion of blue light to yellow/orange light is desirable, for example for achieving white light output. Organic phosphors have the advantage that their luminescence spectrum can be easily adjusted with respect to position and band width and the quantum efficiency is generally higher than for inorganic phosphors. Organic phosphor materials also often have a high degree of transparency, which is advantageous since the efficiency of the lighting system is improved compared to systems using more light-absorbing and/or reflecting phosphor materials. Furthermore, organic phosphors are much less costly than inorganic phosphors. However, since organic phosphors are sensitive to the heat generated during electroluminescence activity of the LED, organic phosphors are primarily used in remote configuration devices.

The main drawback hampering the application of organic phosphor materials in remote phosphor LED based lighting systems is their poor photo-chemical stability.

U.S.2007/0273274 (Horiuchi et al.) discloses a translucent laminate sheet comprising a light-emitting device and comprising an organic phosphor arranged in an airproofed cavity having low concentration of oxygen such that the deterioration of the phosphor is reduced. However, keeping a low concentration of oxygen is difficult and costly.

Hence, there remains a need in the art for improved light-emitting devices employing organic phosphor materials.

SUMMARY OF THE INVENTION

It is an object of the present invention to overcome this problem, and to provide a wavelength converting element comprising a phosphor having increased lifetime.

According to a first aspect of the invention, this and other objects are achieved by a method for manufacturing a wavelength converting element, the method comprising the steps of: providing a polymeric carrier material having a first wavelength converting material dispersed or molecularly dissolved therein, the first wavelength converting material is adapted to convert light of a first wavelength to light of a second wavelength; deforming the polymeric carrier material at a first temperature at or above the glass transition temperature thereof such that at least part of the polymeric carrier material is crystallized; and annealing the polymeric carrier material at a second temperature below the melting temperature thereof.

The polymeric carrier material may advantageously be transparent to light of the first wavelength and the second wavelength.

The stability of the organic phosphor may be improved by incorporation thereof in polymeric materials, and this has recently been described further in the non-published application (EP 10181066.1), hereby incorporated by reference.

The inventors surprisingly found that a wavelength converting material comprised in a polymeric carrier material, after treatment of the polymeric material by the above described method, exhibited excellent stability and thereby improved lifetime.

In particular, the inventors found that by crystallizing the polymer comprising an organic phosphor using so-called stress-induced crystallization, which occurs by deformation of the polymer, at temperature at or above the glass transition temperature of the polymeric material, followed by further crystallization and/ or stabilization by annealing, a highly ordered polymeric matrix having organic phosphor molecules contained therein is achieved, wherein the phosphor molecules showed surprisingly improved stability and increased lifetime, particularly at temperatures around and above the glass temperature of the polymer, where the degradation rate of organic phosphor molecules comprised in the polymeric material decreased by several factors compared to the same polymer which has not been treated by the inventive method.

The terms "crystalline" or "structural order" should, in the context of this application, be understood as any sort of at least partial alignment, arrangement and/or orientation of molecules, for example in a regular periodical pattern, wherein the molecules, to some extent, have a limited degree of freedom. It should be noted that these terms should not be construed as being limited to comprise solid crystals only, but also comprise liquid type crystals. Further, as the degree of "crystalline" or "structural order" relates to the density of the material, quantification of such degree may be obtained inter alia through density measurements.

Given a high degree of crystalline, or structural order, of the polymeric material, as may be achieved through the method according to the invention, the resulting semi-crystalline polymer may have a high transparency of light owing to its low light-scattering properties.

Deforming the polymeric material, which can be realized e.g. by stretching, blow molding or vacuum forming, at a temperature at or above the glass transition temperature thereof, results in a so-called stress-induced crystallization, that is, the polymeric molecules of the polymeric material are at least partially aligned, providing crystallites which form physical cross-links, thus stabilizing the polymer.

By subsequently increasing the temperature of the polymeric material, keeping the temperature below the melting temperature thereof, annealing of the polymeric material is achieved, thus further crystallizing and stabilizing the polymeric material. The temperature at which the annealing step is performed may advantageously be adapted such that optimal crystal growth and/or rearrangement condition may be achieved.

In embodiments of the invention the first temperature may be at or up to 80° C. above the glass transition temperature of the polymeric carrier material, preferably, the first temperature may be at or up 50° C. above the glass transition temperature of the polymeric carrier material, and more preferably, the first temperature may be at or up to 30° C. above the glass transition temperature of the polymeric carrier material. A lower first temperature above the glass transition temperature may be advantageous as the formation of crystallites can be ensured, and diffusion of organic phosphor molecules from the crystalline regions of the polymeric carrier, which may occur at higher temperatures, giving agglomeration thereof and hence quenching of luminescence, may be avoided.

According to one embodiment of the invention the first temperature is lower than the second temperature.

In one embodiment of the invention the polymeric carrier material is deformed during the annealing step. Thus, a desirable shape of the wavelength converting element owing to the deforming thereof may be maintained.

According to one embodiment of the invention the deforming of the polymeric material is performed uni-axially, whereby a wavelength converting element in a form of, for example, a fiber is produced. Alternatively, the deforming is performed bi-axially and thereby wavelength converting elements in the form of, for example, a film, a tube or tape is obtained. Thus, the wavelength converting element may be in a form having a substantially two-dimensional extension, for example, having a length and/or width up to several meters and a thickness (or diameter) in the range of 0.001-1 mm.

Alternatively, the deformation of the polymeric material is achieved by methods such as, for example, blow molding or vacuum forming, thereby giving wavelength converting elements in forms of three-dimensional shapes such as, for example, bulb shaped which can be adapted to fit with a given desired application.

According to one embodiment of the invention the content of the first wavelength converting material in the polymeric carrier material is 1% or less by weight, for example 0.1% or less by weight, such as 0.01% or less by weight.

According to one embodiment of the present invention the first wavelength converting material comprises a perylene derivative and/or quantum dot. According to one embodiment of the present invention the first wavelength converting material comprises an organic phosphor.

According to a second aspect of the present invention, the above-mentioned and other objects are achieved through a wavelength converting element comprising a semi-crystalline polymeric material comprising polymeric molecules having a degree of crystalline, wherein the polymeric material comprising at least one wavelength converting material dispersed therein, and wherein the degree of crystalline is 10% by volume or more, for example, 20% by volume or more, such as 30% by volume or more.

In one embodiment of the invention the wavelength converting element is comprised in a second polymeric matrix, wherein the wavelength converting elements is in the form of particles which are dispersed in the second polymeric matrix. The particles may be in the form of fibers preferably having a diameter in the range of 0.01-1 mm. Further, the second polymeric matrix may be substantially transparent and having a relatively low glass transition and/or melting temperature, for example a polymer such as poly(methyl methacrylate) or polycarbonate or polystyrene, thus allowing processing of a second polymeric matrix, comprising particles of the wavelength converting element, below the melting temperature of the polymeric carrier material comprised in the wavelength converting element.

Effects and features of this second aspect of the present invention are largely analogous to those described above in connection with the first aspect of the invention.

Furthermore, the wavelength converting element according to the present invention may advantageously be comprised in a light-emitting device further comprising at least one light source adapted to emit light of a first wavelength, wherein the wavelength converting element is arranged to receive light of the first wavelength and adapted to convert at least part of the light of the first wavelength to light of a second wavelength.

In one embodiment of the invention the at least one light source advantageously is a solid state light source such as, for example, a LED or a laser, preferably emitting light in the blue violet or ultraviolet part of the light spectrum. It is noted that the invention relates to all possible combinations of features recited in the claims.

BRIEF DESCRIPTION OF THE DRAWINGS

This and other aspects of the present invention will now be described in more detail, with reference to the appended drawings showing exemplary embodiment(s) of the invention, wherein:

FIG. 1 is a flow-chart schematically illustrating a preferred embodiment of a method for manufacturing of a wavelength converting element according to the present invention;

FIGS. 2a-c are enlarged cross-sectional views of the optical element, where each view corresponds to a stage of the manufacturing process according to the method of FIG. 1;

DETAILED DESCRIPTION

Figure 3A:
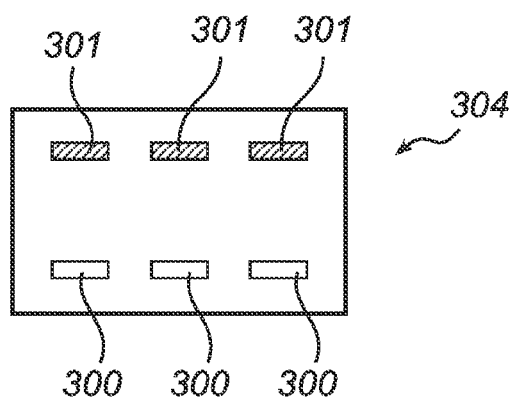
FIGS. 3a-e show a cross-sectional side view of embodiments of a light-emitting device according to the invention.

In the following description, the present invention is described with reference to a method for manufacturing of a wavelength converting element having at least one wavelength converting material incorporated therein. Below, the invention is described with regard to its preferred embodiments which comprise the best mode presently known to the inventor, however, it should be understood that various changes and modifications as would be obvious to one having ordinary skills in the art may be made without departing from the scope of the invention as set forth in the claims appended hereto.

FIG. 1 schematically illustrates the preferred steps 100-102 of the method according to the invention, and FIGS. 2a-c show the resulting wavelength converting element 202 after each of these steps 100-102. A preferred embodiment according to the invention will now be described in detail with reference to FIG. 1 and FIGS. 2a-c.

The first step 100 involves providing a polymeric carrier material 200 having a first wavelength converting material 201 dispersed or molecularly dissolved therein. This can be achieved by either polymerization of a monomeric mixture comprising a light converting material and thereby obtaining a polymer comprising the light converting material, alternatively, the wavelength converting material may be dispersed or dissolved in the polymer at a temperature above the melting temperature of the polymer. Subsequently, the mixture may be first quenched to below the glass temperature of the polymeric material and then heated to a desirable temperature at which the deformation step 101 is performed, alternatively, the mixture is directly cooled/quenched to the temperature of the deformation step 101. The polymeric carrier material 200 is embodied in FIG. 2a as being in a substantially amorphous state, however, it should be noted that the polymeric carrier material might as well be embodied as being in a more semi-crystalline state, as this might vary depending on the composition of the polymeric material as well as on the methods used, for example the extrusion method and quenching temperature used, to provide the mixture of the materials. Also, it should be noted that FIGS. 2a-c are, of course, enlarged views of the wavelength converting element where only a few polymeric molecules are shown, however, the skilled person in the art would no doubt realise that the polymeric carrier material would typically comprise a large number of molecules, all of which may have different structural conformations and crystal formations.

In one embodiment of the invention the polymeric carrier material 200 comprises a polyester which may comprise an aromatic moiety incorporated into the polymer backbone. Typically, the polymeric carrier material may comprise polyethylene terephthalate (PET) and/or a copolymer thereof and/or polyethylene naphthalate (PEN) and/or a copolymer thereof (see also European patent application EP 10181066.1 for more options of the polymeric material).

Furthermore, as would be understood by the skilled person, the present inventive method does not relate to the use of any specific organic phosphor compounds, and consequently, the wavelength converting material may comprise any organic phosphor compounds with desirable properties for a given application of the wavelength converting element. However, perylene derived compounds such as perylene bis and mono amides, for example, any one of dyes 'F170', 'F240', 'F083', 'F300' or 'F305', which are commercially available, may advantageously be used as these phosphor compounds show high stability.

According to one embodiment of the present invention the first wavelength converting material may comprise nano phosphors such as so-called quantum dots, comprising, for example, cadmium selenide and/or indium phosphide.

The concentration of the wavelength converting material may be 1% or less, preferably 0.1% or less, more preferably 0.01% or less by weight, and even more preferably 10 ppm or less by weight, based on the total weight of the polymeric carrier material and the wavelength converting material.

In the second step 101, the polymeric carrier material 200 having a first wavelength converting material 201 dispersed therein is deformed at a first temperature at or above the glass transition temperature thereof, for example, at or up to 80° C. above the glass temperature thereof. Typically, the first temperature of the polymeric carrier material may be at or up to 50° C. above the glass transition temperature thereof, or for example, at or up to 30° C. above the glass transition temperature thereof. This treatment, so-called stress induced-crystallization, results in areas 203 comprising micro crystallites, shown in FIG. 2b, wherein the polymeric molecules 200 of the polymeric carrier material are at least partially macroscopically ordered. At this stage, densification of the material occurs. As is indicated in FIG. 2b, the deforming of the polymeric carrier material may, for example, be performed uni-axially, or alternatively bi-axially (not shown). The deforming of the polymeric carrier material may also involve methods such as blow molding or vacuum forming.

Given the means of deforming, the wavelength converting element may be obtained in the form of a film, a fiber, a tube or a tape, having a thickness (or diameter) in the range of 0.001-1 mm and a length and/or a width up to several meters. Alternatively, by means of, for example, blow molding or vacuum molding, more three-dimensional forms are possible such as, for example, bulb shaped.

The third step 102 involves annealing of the polymeric carrier material 200 having a first wavelength converting material 201 dispersed therein at a second temperature below the melting temperature thereof. This second temperature is typically higher than the first temperature at which the second step 101 is performed. As shown in FIG. 2c, in this third step 102 the degree of crystalline and macroscopic order is further increased, thus further stabilizing the material. These transformations of the polymeric material 200 can be seen in an increase in density thereof. In embodiments of the invention deforming of the polymeric carrier material 200 may to some extent also be carried out during the third step 102.

The wavelength converting element 202 may optionally comprise a second wavelength converting material adapted to convert light of the first wavelength to light of a third wavelength. The second wavelength converting material may be an inorganic phosphor material, for example, cerium doped yttrium aluminium garnet (YAG) or lutetium aluminium garnet (LuAG), or a second organic phosphor compound. Thus, using more than one wavelength converting material, the spectral composition of the output light can be more conveniently adapted as desired. In another embodiment of the invention the wavelength converting element may comprise scattering particles such as, for example, AlOx. The second wavelength converting material and/or the scattering particles can be dispersed in the same layer of polymeric carrier material, undergoing the same process of FIG. 2, or alternatively can be dispersed in a separate layer of the same or different polymeric carrier material, applied on the layer containing the first wavelength converting material in an additional process step, for instance by coating or laminating.

Figure 3B:
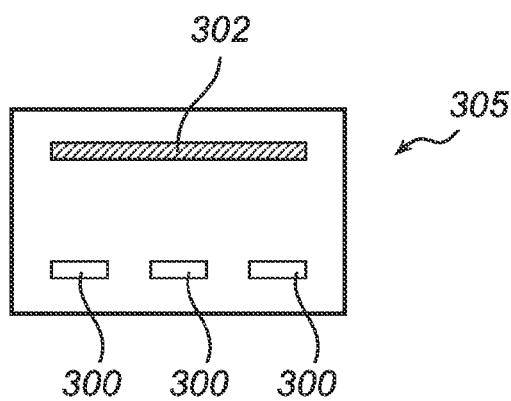
Figure 3C:
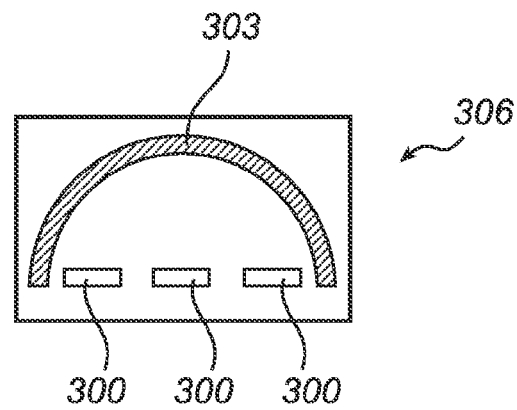
Figure 3D:
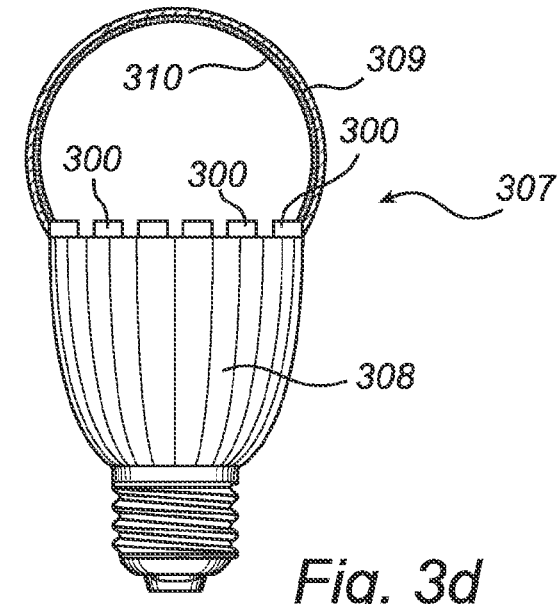

FIGS. 3a-e show a cross-sectional side view of exemplary embodiments of a light-emitting device 304, 305, 306, 307, 314 according to the invention comprising a plurality of LEDs 300, and at least one wavelength converting element 301, 302, 303, 310, 312 arranged at a distance from the LEDs 300 in so-called remote configuration to receive light of a first wavelength emitted from the LEDs 300 and adapted to convert at least part of the light of the first wavelength to light of a second wavelength. The polymeric carrier material is typically light transmissive, such that light emitted by the LEDs and/or converted by the wavelength converting material comprised in the wavelength converting element 301, 302, 303, 310, 312 may be transmitted through the polymeric carrier material. As shown in FIG. 3a, a light-emitting device 304 may comprise a plurality of wavelength converting elements 301, each one arranged to receive light from a single LED 300, or as shown in FIGS. 3b-d, a light-emitting device 305, 306, 307 comprising a single wavelength converting element 302, 303, 310 arranged to receive light from all of the LEDs 300. Further, as is illustrated in FIG. 3c-d, the wavelength converting element 303, 310 may be shaped as a dome or bulb. The wavelength converting element may also be in the form of a film which can be curved and fitted into or wrapped around a glass tube, and such tube can be provided with light-emitting diodes to function as a retrofit fluorescent lamp. FIG. 3d shows an embodiment of the light-emitting device according to the invention which is here provided as a retrofit lamp 307 comprising a base part 308 provided with a traditional cap 308.The light converting element 310 in FIG. 3d is in a bulb shaped form in order to fit with the corresponding form of the light outlet member 309.

Figure 3E:
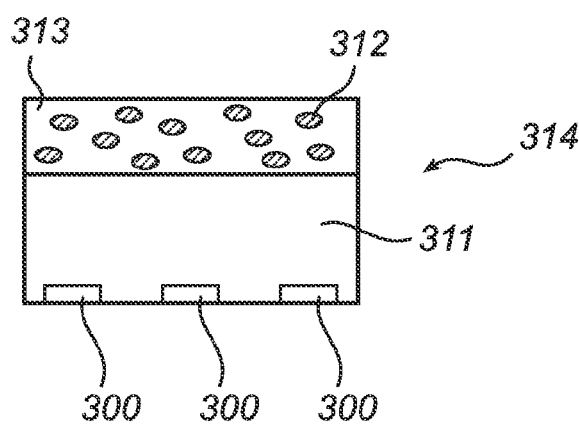

FIG. 3e shows an embodiment of the light-emitting device 314 according to the invention wherein a plurality of wavelength converting elements 312 are dispersed in a second polymeric matrix 313. The wavelength converting elements 312 may be in the form of particles 312 having a thickness in the range of 0.01-1 mm. By incorporating wavelength converting elements 312 in a second polymeric matrix 313 components comprising the wavelength converting element having a desired design can easily be produced by, for example, injection molding techniques. In FIG. 3e the second polymeric matrix 313 is arranged on top of a reflective chamber 311 comprising LEDs 300.

The person skilled in the art realizes that the present invention by no means is limited to the exemplary embodiments described above. For example, FIGS. 3a-e are only exemplary embodiments of light-emitting devices wherein the wavelength converting element of the invention may be used, it should be understood that the wavelength converting element can be adapted and used in virtually any type of light-emitting device wherein conversion of light from one wavelength to another is desired. Furthermore, the wavelength converting element may be applied as a coating on any light-emitting device. It is also contemplated that the wavelength converting member may be a self-supporting layer, such as a film or sheet standing free from a light-emitting device having any suitable shape.

The advantages of the method according to the present invention have been demonstrated in experiments.

EXAMPLE

Figure 4:
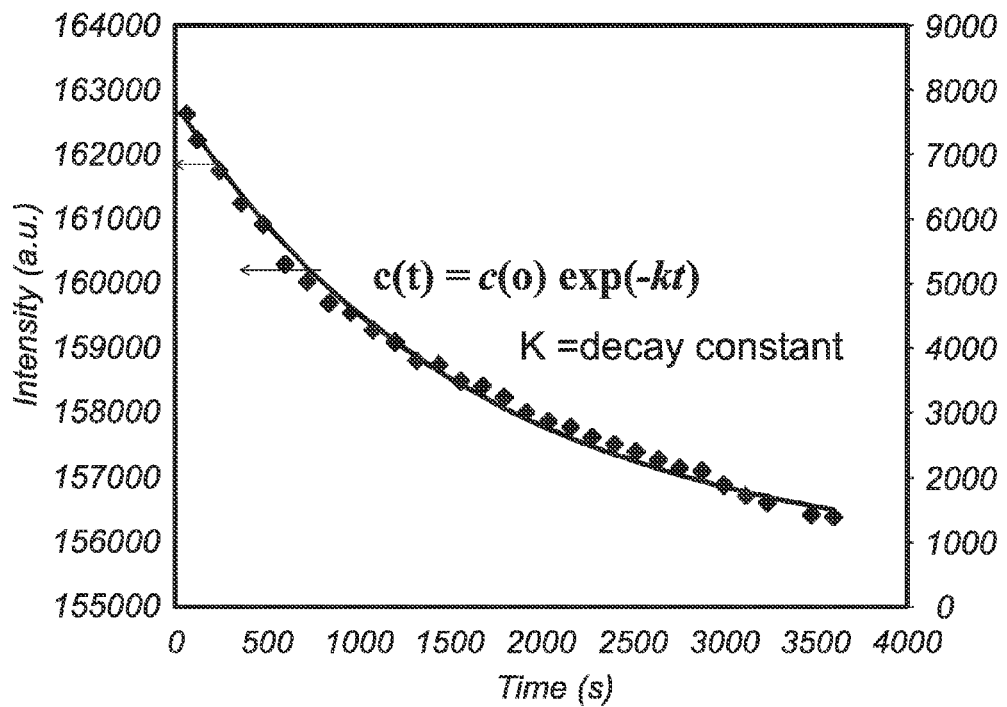
FIG. 4 shows a plot of the emission from a layer of a PET matrix comprising a phosphor material as a function of time.

In one experiment 0.015% Red F305 dye (which is a commercially available organic phosphor) in a PET matrix was used which was prepared by extrusion and subsequently quenching to room temperature. FIG. 4 shows the emission from a layer of the prepared PET matrix comprising the phosphor material illuminated with blue light of 450 nm at a light flux density of 4.2 W/cm$^2$ as a function of time. The initial absorption in the layer is 10% therefore the intensity is directly related to the dye concentration. As can be seen, the intensity is an exponential function of time with a decay rate k.

Figure 5:
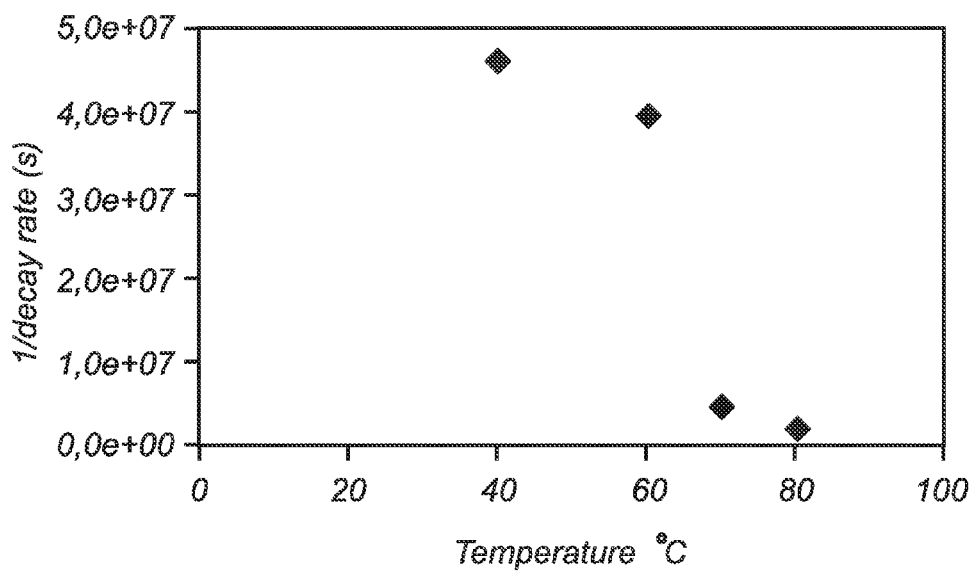
FIG. 5 shows a plot of the inverse decay rate of a phosphor material comprised in a PET matrix as a function of temperature.

The prepared polymeric material containing the phosphor material was then illuminated with blue light of 450 nm at a light flux density of 4.2 W/cm$^2$ and the decay rate was measured at various temperatures. In FIG. 5 the inverse decay rate, which is a measure of the lifetime, is plotted as a function of temperature. As can be seen in FIG. 5, the decay rate of the phosphor increases rapidly just above 60° C. leading to a fast decrease in lifetime of the phosphor.

Clearly in polymers such as polycarbonate and PET the rate of degradation of the dye increases rapidly above the glass transition temperature thereof, thus limiting the application temperature range of luminescent dyes.

The prepared polymeric material containing the phosphor material was then treated according to one embodiment of the inventive method: by first heating the material to 90° C. (which is above the glass transition temperature of PET) at which temperature the material was stretched, and subsequently annealing the material at 150° C. It was found that after such treatment of the material the decay constant decreased from $4.6*10^{-7}$ to $6.2*10^{-8}$ at a temperature of 80° C. in air, corresponding to an increase of about a factor of 7 in the lifetime of the phosphor.

The invention claimed is:

1. A method for manufacturing a wavelength converting element, said method comprising the steps of:
    providing a polymeric carrier material having a first wavelength converting material dispersed or molecularly dissolved therein; said first wavelength converting material is adapted to convert light of a first wavelength to light of a second wavelength;
    deforming said polymeric carrier material at a first temperature at or above the glass transition temperature thereof such that at least part of said polymeric carrier material is crystallized; and
    annealing said polymeric carrier material at a second temperature below the melting temperature thereof.

2. A method according to claim 1, wherein said first temperature is at or up to 80° C. above the glass transition temperature of said polymeric carrier material.

3. A method according to claim 1, wherein said first temperature is lower than said second temperature.

4. A method according to claim 3, wherein said polymeric carrier material is deformed during said annealing step.

5. A method according to claim 4, wherein said deforming of said polymeric carrier material is performed biaxially or uniaxially.

6. A method according to claim 5, wherein said wavelength converting element after said deforming is in a form of a film, a fiber, a tube or a tape.

7. A method according to claim 6, wherein said deforming of said polymeric carrier material is achieved by blow molding or vacuum forming thereof.

8. A method according to claim 7, wherein said polymeric carrier material comprises polyethylene terephthalate (PET) and/or a copolymer thereof and/or polyethylene naphthalate (PEN) and/or a copolymer thereof.

9. A method according to claim 8, wherein said first wavelength converting material comprises a perylene derivative and/or a quantum dot.

10. A wavelength converting element manufactured according to the method of claim 9.

11. The method of claim 1, wherein the deforming comprises applying a stress to the polymeric carrier material.

12. The method of claim 3, wherein the deforming comprises applying a stress to the polymeric carrier material.

13. A wavelength converting element comprising a semi-crystalline polymeric material comprising polymeric molecules having a degree of crystalline, wherein said polymeric material comprising at least one wavelength converting material dispersed therein, wherein a decay constant of said at least one wavelength converting material is at most $6.2 \times 10^{-8}$ when said wavelength converting material is illuminated with blue light of 450 nm at a light flux density of 4.2 w/cm$^2$, wherein intensity of light emitted by said at least one wavelength converting material varies in accordance with $c(0)e^{(-kt)}$, wherein k is the decay constant, t is time in seconds, and c(o) is an initial intensity at time t=0.

14. A wavelength converting element according to claim 13, wherein said degree of crystalline is 20% by volume or more.

15. A wavelength converting element according to claim 13, wherein said degree of crystalline is 30% by volume or more.

16. A wavelength converting element according to claim 15, wherein said wavelength converting element is comprised in a second polymeric matrix.

17. A light-emitting device comprising a light source adapted to emit light of a first wavelength, and a wavelength converting element according to claim 16, wherein said wavelength converting element is arranged to receive light of said first wavelength and adapted to convert at least part of the light of said first wavelength to light of a second wavelength.

18. A wavelength converting element according to claim 13, wherein said degree of crystalline is 10% by volume or more.

19. A wavelength converting element according to claim 16, wherein the wavelength converting element is in the form of particles which are dispersed in said second polymeric matrix.

* * * * *